United States Patent
Carothers et al.

(10) Patent No.: US 9,419,075 B1
(45) Date of Patent: Aug. 16, 2016

(54) WAFER SUBSTRATE REMOVAL

(71) Applicant: Texas Instruments Incorporated, Dallas, TX (US)

(72) Inventors: Dan Carothers, Lucas, TX (US); Rajarshi Mukhopadhyay, Allen, TX (US); Paul Brohlin, Parker, TX (US); Benjamin Cook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/701,484

(22) Filed: Apr. 30, 2015

Related U.S. Application Data

(60) Provisional application No. 62/108,799, filed on Jan. 28, 2015.

(51) Int. Cl.

| H01L 21/76 | (2006.01) |
|---|---|
| H01L 29/06 | (2006.01) |
| H01L 23/522 | (2006.01) |
| H01L 23/528 | (2006.01) |
| H01L 21/762 | (2006.01) |
| H01L 21/8234 | (2006.01) |
| H01L 21/02 | (2006.01) |
| H01L 21/78 | (2006.01) |
| H01L 21/683 | (2006.01) |

(52) U.S. Cl.
CPC ...... *H01L 29/0649* (2013.01); *H01L 21/02282* (2013.01); *H01L 21/6835* (2013.01); *H01L 21/76224* (2013.01); *H01L 21/78* (2013.01); *H01L 21/823475* (2013.01); *H01L 21/823481* (2013.01); *H01L 23/528* (2013.01); *H01L 23/5223* (2013.01); *H01L 2221/68327* (2013.01)

(58) Field of Classification Search
CPC ........... H01L 21/76801; H01L 21/76898; H01L 21/76844; H01L 23/293; H01L 23/5329; H01L 29/66181
USPC .......................................... 257/310
See application file for complete search history.

(56) References Cited

U.S. PATENT DOCUMENTS

| 5,371,047 A * | 12/1994 | Greco | H01L 21/76801 148/DIG. 43 |
|---|---|---|---|
| 9,312,208 B2 * | 4/2016 | Chen | H01L 21/76898 |
| 2002/0151165 A1 * | 10/2002 | Chung | H01L 21/76844 438/618 |
| 2014/0124845 A1 * | 5/2014 | Cheng | H01L 29/66181 257/310 |

\* cited by examiner

*Primary Examiner* — Michael Lebentritt
(74) *Attorney, Agent, or Firm* — John R. Pessetto; Frank D. Cimino

(57) ABSTRACT

A semiconductor device is formed on a semiconductor substrate, including a primary portion of the substrate. An active component of the semiconductor device is disposed in the primary portion of the substrate. An interconnect region is formed on a top surface of the substrate. Semiconductor material is removed from the substrate in an isolation region, which is separate from the primary portion of the substrate; the isolation region extends from the top surface of the substrate to a bottom surface of the substrate. A dielectric replacement material is formed in the isolation region. The semiconductor device further includes an isolated component which is not disposed in the primary portion of the substrate. The dielectric replacement material in the isolation region separates the isolated component from the primary portion of the substrate.

11 Claims, 14 Drawing Sheets

WAFER SUBSTRATE REMOVAL

CROSS-REFERENCE TO RELATED APPLICATIONS

This application claims the benefit of priority under U.S.C. §119(e) of U.S. Provisional Application 62/108,799, filed Jan. 28, 2015, which is hereby incorporated by reference in its entirety.

FIELD OF THE INVENTION

This invention relates to the field of semiconductor devices. More particularly, this invention relates to isolation structures in semiconductor devices.

BACKGROUND OF THE INVENTION

Numerous circuit applications have components which are isolated from other components to improve functionality of the circuits. In one example, some circuit applications use passive components such as capacitors, inductors and transformers for signal communication or power transfer. When such passive components are disposed in a semiconductor device with other components, coupling to the substrate of the semiconductor device undesirably degrades performance of the passive components. Alternatively, disposing the passive components in separate chips undesirably increases costs of the circuit applications. In another example, some circuits have active components which must be electrically isolated from other active components. Forming deep isolation structures such as deep wells, buried layers and sinkers, or disposing the active components in separate chips, undesirably increases costs of the circuit applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device is formed on a substrate comprising a semiconductor material. An interconnect region is formed on a top surface of the substrate. The semiconductor material is removed in an isolation region, which extends from the top surface of the substrate to a bottom surface of the substrate, leaving a primary portion of the substrate. A dielectric replacement material is formed in the isolation region. An active component of the semiconductor device is disposed in the primary portion of the substrate. The semiconductor device further includes an isolated component which is not disposed in the primary portion of the substrate. The dielectric replacement material in the isolation region separates the isolated component from the primary portion of the substrate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device is formed on a substrate comprising a semiconductor material. An interconnect region containing contacts and metal lines and possibly vias is formed on a top surface of the substrate. The semiconductor material is removed in an isolation region, which extends from the top surface of the substrate to a bottom surface of the substrate, leaving a primary portion of the substrate. A dielectric replacement material is formed in the isolation region. An active component of the semiconductor device is disposed in the primary portion of the substrate. The semiconductor device further includes an isolated component which is not disposed in the primary portion of the substrate. The dielectric replacement material in the isolation region separates the isolated component from the primary portion of the substrate. The isolated component may possibly be disposed in the interconnect region with the isolation region underlying the isolated component, so that the primary portion of the substrate is lower than and laterally adjacent to the isolated component. The isolated component may possibly be disposed in a portion of the substrate which is laterally separated by the isolation region from the primary portion of the substrate.

Figure 1A:
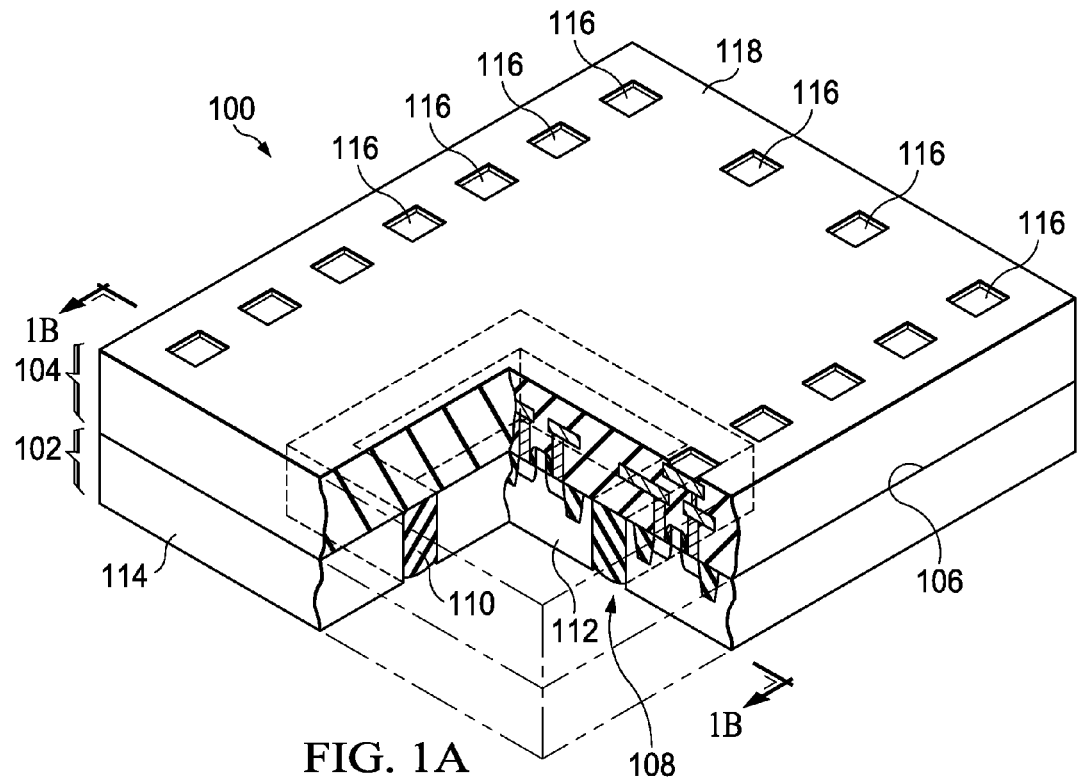
FIG. 1A through FIG. 1C are views of an example semiconductor device containing an isolation region and an isolated component.
Figure 1C:
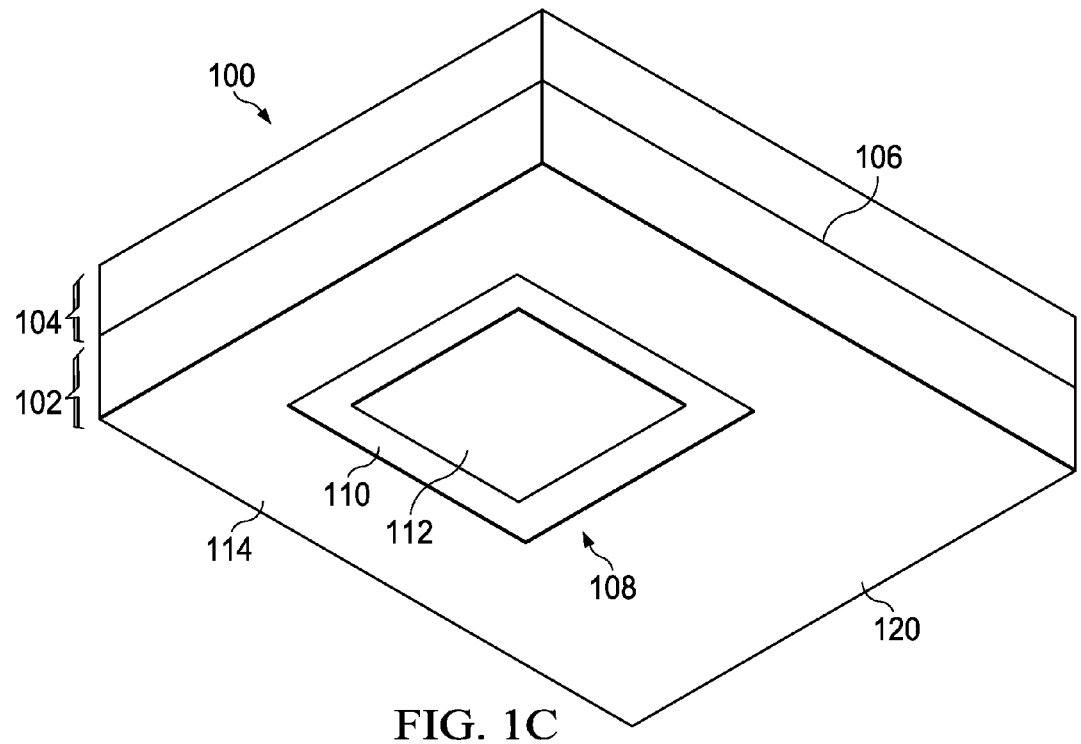
Figure 1B:
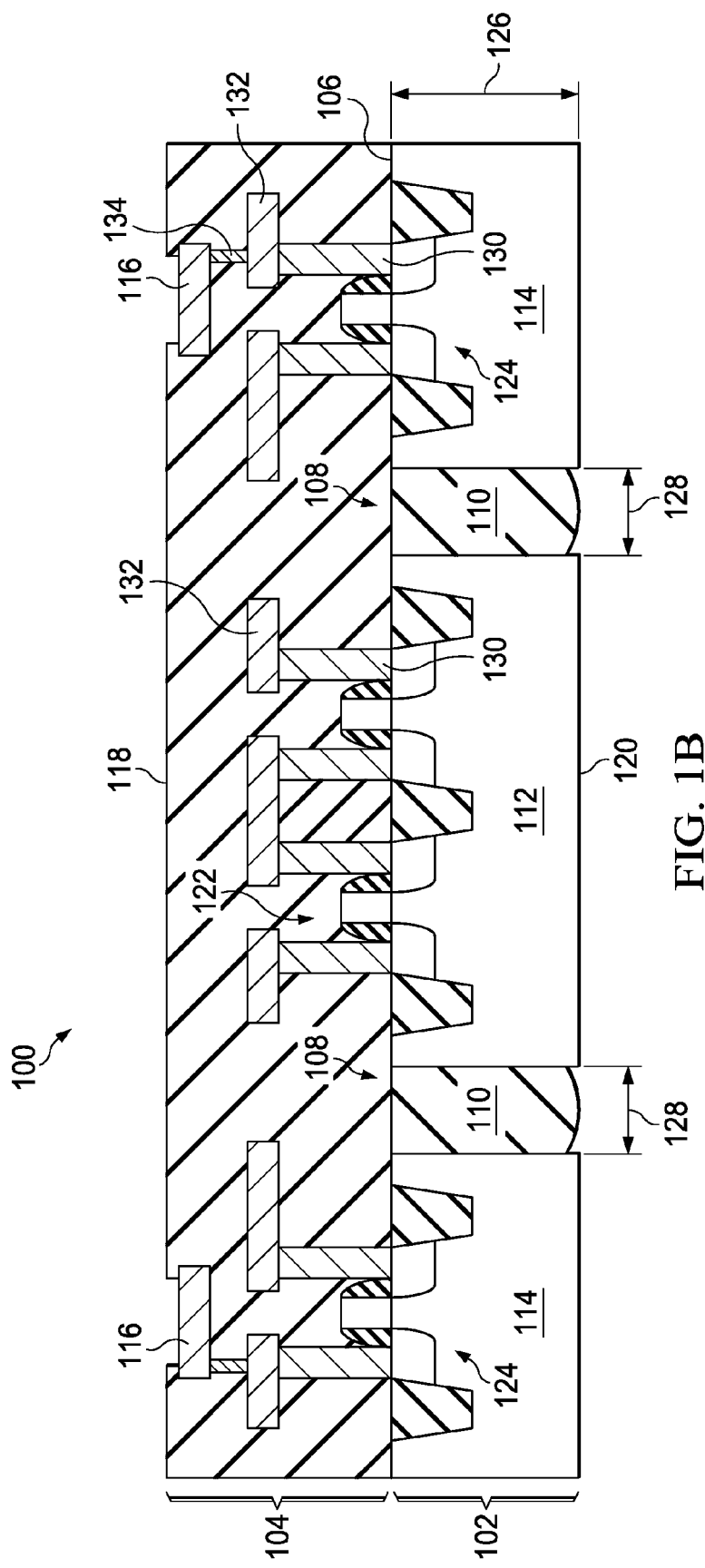

FIG. 1A through FIG. 1C are views of an example semiconductor device containing an isolation region and an isolated component. Referring to FIG. 1A, which is a top perspective view, the semiconductor device 100 includes a substrate 102 comprising a semiconductor material such as silicon. The substrate 102 may be from a bulk semiconductor wafer, and may optionally include an epitaxial layer of semiconductor material. The semiconductor device 100 includes an interconnect region 104 at a top surface 106 of the substrate 102. The interconnect region 104 includes layers of dielectric material, one or more levels of metal lines, contacts connecting the metal lines to components in the substrate 102, and possibly vias connecting the metal lines of different levels. The semiconductor device 100 further includes an isolation region 108 in which the semiconductor material has been removed from the substrate 102 and replaced with dielectric replacement material 110. In the instant example, the dielectric replacement material 110 in the isolation region 108 laterally surrounds an isolated portion 112 of the substrate 102. A primary portion 114 of the substrate 102 is outside of the isolation region 108 and abuts the isolation region 108. In the instant example, the primary portion 114 laterally surrounds the isolation region 108 and the isolated portion 112. The isolation region 108 separates the isolated portion 112 from the primary portion 114 of the substrate 102. The interconnect region 104 is continuous over the isolation region 108. The interconnect region 104 has a top surface 118 at an opposite face of the interconnect region 104 from the top surface 106 of the substrate 102. In the instant example, the semiconductor device 100 includes bond pads 116 at the top surface 118 of the interconnect region 104.

Referring to FIG. 1B, which is a cross section through the semiconductor device 100, the isolation region 108 extends vertically from a bottom surface 120 of the substrate 102 to the interconnect region 104. The dielectric replacement material 110 substantially fills the isolation region 108. The dielectric replacement material 110 may include organic dielectric material such as epoxy, polyimide, or benzocyclobutene (BCB). Alternately, the dielectric replacement material 110 may include inorganic dielectric material such as ceramic or silicon dioxide-based inorganic material formed from siloxane-containing solution or sol-gel. The dielectric replacement material 110 does not completely cover the bottom surface 120 of the substrate 102. In the instant example, the bottom surface 120 is substantially free of the dielectric replacement material 110. An isolated component 122, depicted in FIG. 1B as an inverter, is disposed in the isolated portion 112 of the substrate 102. The dielectric replacement material 110 in the isolation region 108 separates the isolated component 122 from the primary portion 114 of the substrate 102. Active components 124 of the semiconductor device 100 are disposed in the primary portion 114 of the substrate 102. A thickness 126 of the substrate 102 may be 200 microns for a thinned substrate 102 to 600 microns for a full-thickness substrate 102. In the instant example, a width 128 of the isolation region 108 may be, for example, 10 microns to 500 microns. Contacts 130, metal lines 132 and vias 134 in the interconnect region 104 provide electrical connections to the isolated component 122 and the active components 124, and to the bond pads 116.

Referring to FIG. 1C, which is a bottom perspective view of the semiconductor device 100, the bottom surface 120 of the substrate 102 is substantially free of the dielectric replacement material 110 of the isolation region 108. Disposing the isolated portion 112 of the substrate 102 in the semiconductor device 100 may advantageously reduce a total cost of circuit application using the semiconductor device 100 compared to disposing the isolated portion 112 in a separate semiconductor device.

Figure 2A:
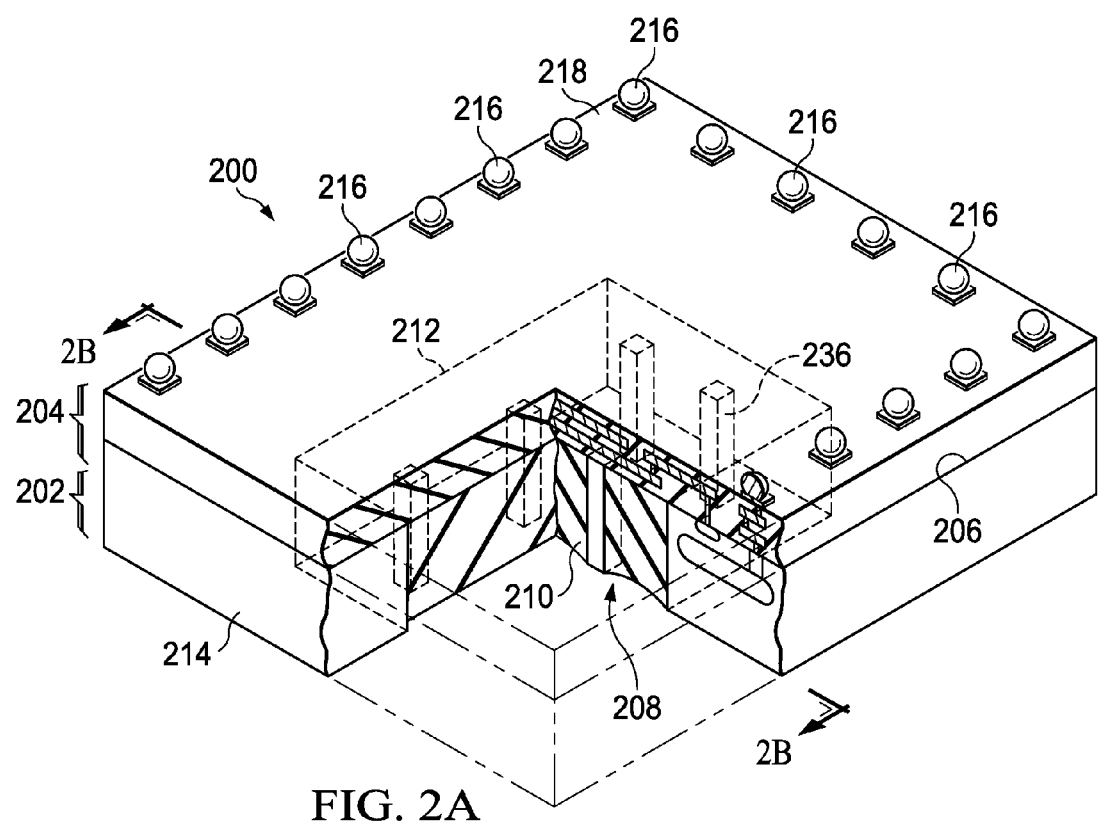
FIG. 2A through FIG. 2C are views of another example semiconductor device containing an isolation region and an isolated component.
Figure 2C:
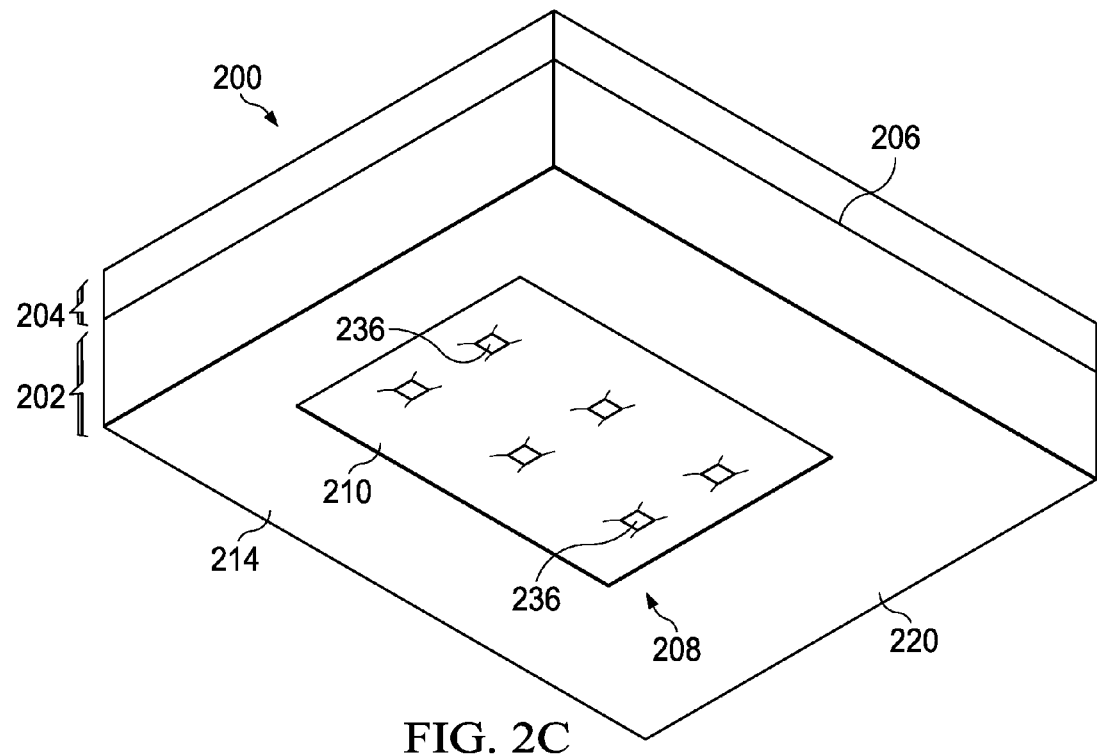
Figure 2B:
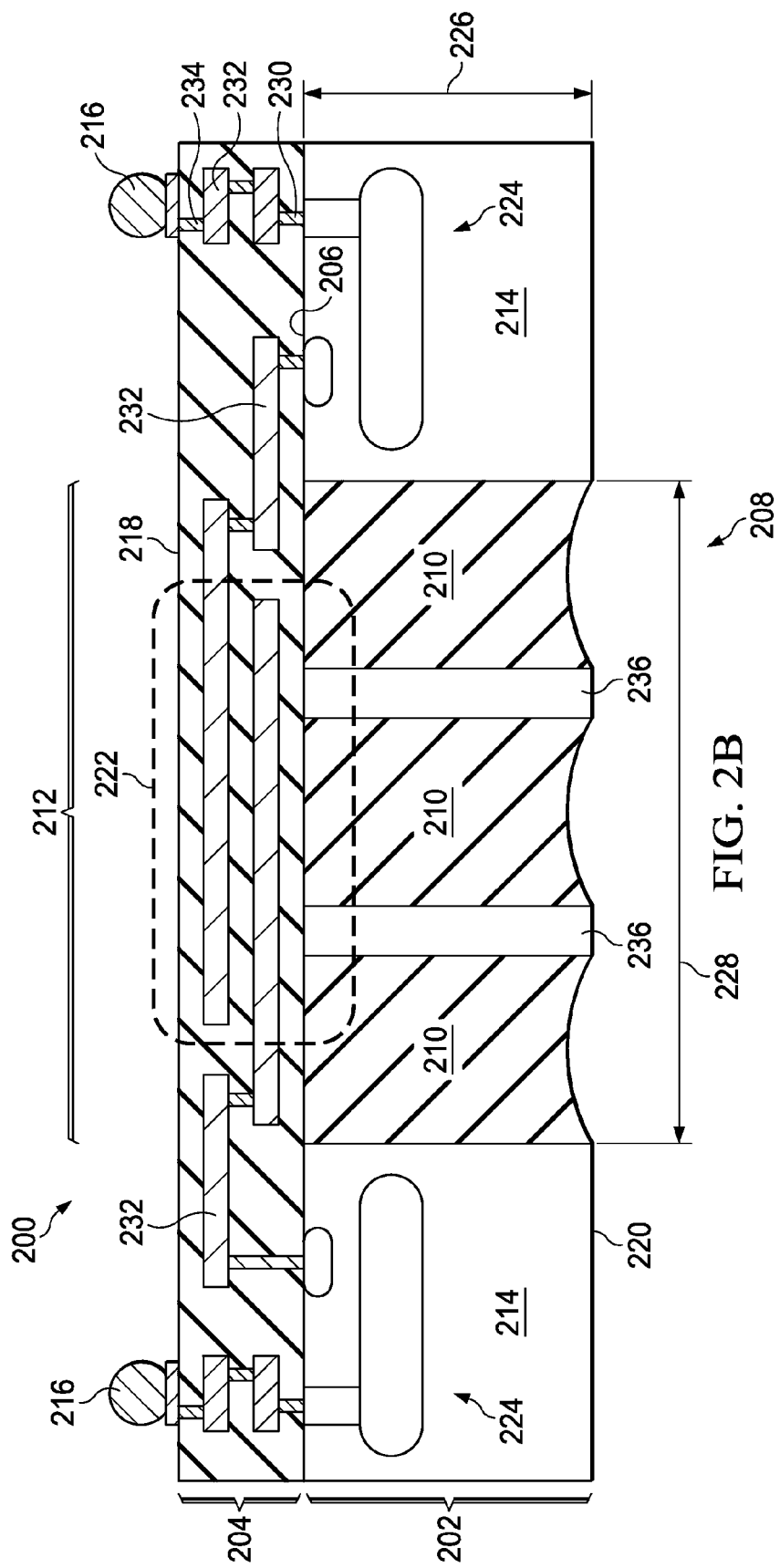

FIG. 2A through FIG. 2C are views of another example semiconductor device containing an isolation region and an isolated component. Referring to FIG. 2A, which is a top perspective view, the semiconductor device 200 includes a substrate 202 comprising a semiconductor material, for example as described in reference to FIG. 1A. The semiconductor device 200 includes an interconnect region 204 at a top surface 206 of the substrate 202. The interconnect region 204 includes layers of dielectric material, one or more levels of metal lines, contacts connecting the metal lines to components in the substrate 202, and possibly vias connecting the metal lines of different levels. The semiconductor device 200 further includes an isolation region 208 in which the semiconductor material has been removed from the substrate 202 and replaced with dielectric replacement material 210. A primary portion 214 of the substrate 202 is outside of the isolation region 208 and abuts the isolation region 208. In the instant example, the primary portion 214 laterally surrounds the isolation region 208. In the instant example, the dielectric replacement material 210 in the isolation region 208 underlies an isolated portion 212 of the interconnect region 204. The isolated portion 212 is laterally proximate to the primary portion 214 of the substrate 202, but the isolated portion 212 of the interconnect region 204 does not overlap the primary portion 214 of the substrate 202. Dummy elements 236 of the semiconductor material of the substrate may optionally be present in the isolation region 208, surrounded by the dielectric replacement material 210, to reduce dishing of the dielectric replacement material 210. The dummy elements 236 contain no active components. The interconnect region 204 has a top surface 218 at an opposite face of the interconnect region 204 from the top surface 206 of the substrate 202. In the instant example, the semiconductor device 200 includes solder bumps 216 at the top surface 218 of the interconnect region 204.

Referring to FIG. 2B, which is a cross section through the semiconductor device 200, the isolation region 208 extends from a bottom surface 220 of the substrate 202 to the interconnect region 204. The dielectric replacement material 210 substantially fills the isolation region 208. The dielectric replacement material 210 may include organic dielectric material or inorganic dielectric material. The dielectric replacement material 210 does not cover the bottom surface 220 of the substrate 202. In the instant example, the bottom surface 220 is substantially free of the dielectric replacement material 210. An isolated component 222, depicted in FIG. 2B as a capacitor, is disposed in the isolated portion 212 of the interconnect region 204. The dielectric replacement material 210 in the isolation region 208 separates the isolated component 222 from the primary portion 214 of the substrate 202. One or more active components 224 of the semiconductor device 200 are disposed in the primary portion 214 of the substrate 202. A thickness 226 of the substrate 202 may be 200 microns for a thinned substrate 202 to 600 microns for a full-thickness substrate 202. In the instant example, a width 228 of the isolation region 208 may be, for example, 100 microns to 3000 microns, depending on a size of the isolated component 222. The optional dummy elements 236, if present, may reduce dishing of the dielectric replacement material 210 adjacent to the bottom surface 220 of the substrate 202. Contacts 230, metal lines 232 and vias 234 in the interconnect region 204 provide electrical connections to the isolated component 222 and the active components 224. Disposing the isolated component 222 in the interconnect region 204 of the semiconductor device 200 may advantageously reduce a total cost of circuit application using the semiconductor device 200 compared to disposing the isolated component 222 in a separate device.

Referring to FIG. 2C, which is a bottom perspective view of the semiconductor device 200, the bottom surface 220 of the substrate 202 is substantially free of the dielectric replacement material 210 of the isolation region 208. The optional dummy elements 236, if present, may advantageously provide the dielectric replacement material 210 to be substantially coplanar to the bottom surface 220 of the substrate 202, which may facilitate mounting the semiconductor device 200 in a carrier or board.

Figure 3A:
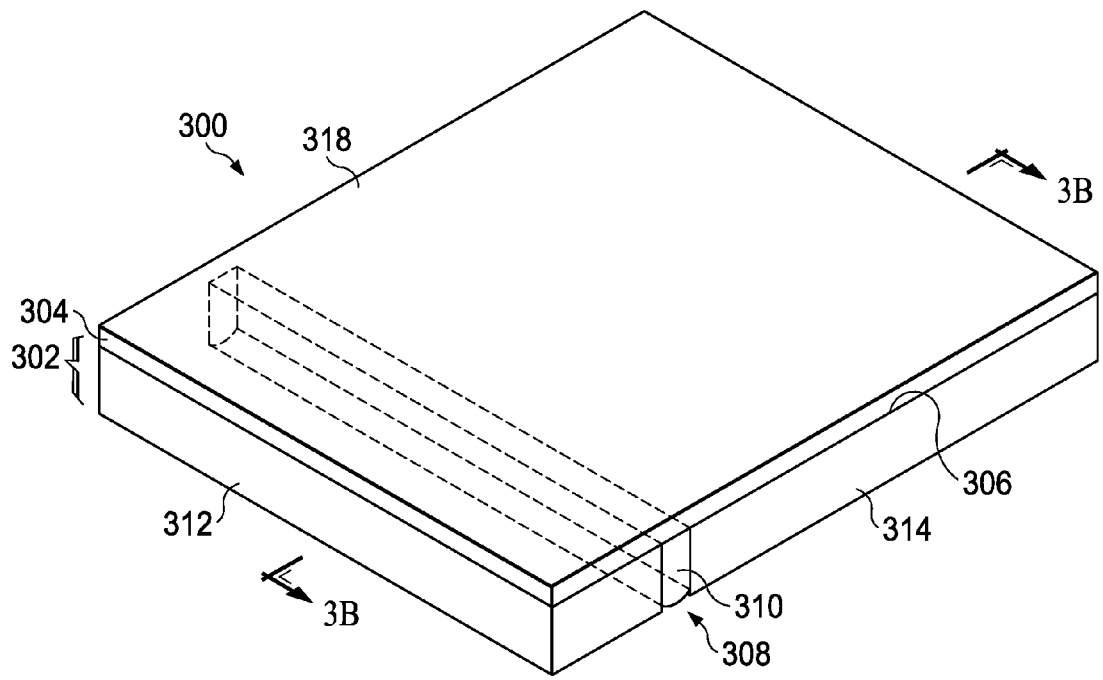
FIG. 3A through FIG. 3C are views of a further example semiconductor device containing an isolation region and an isolated component.
Figure 3C:
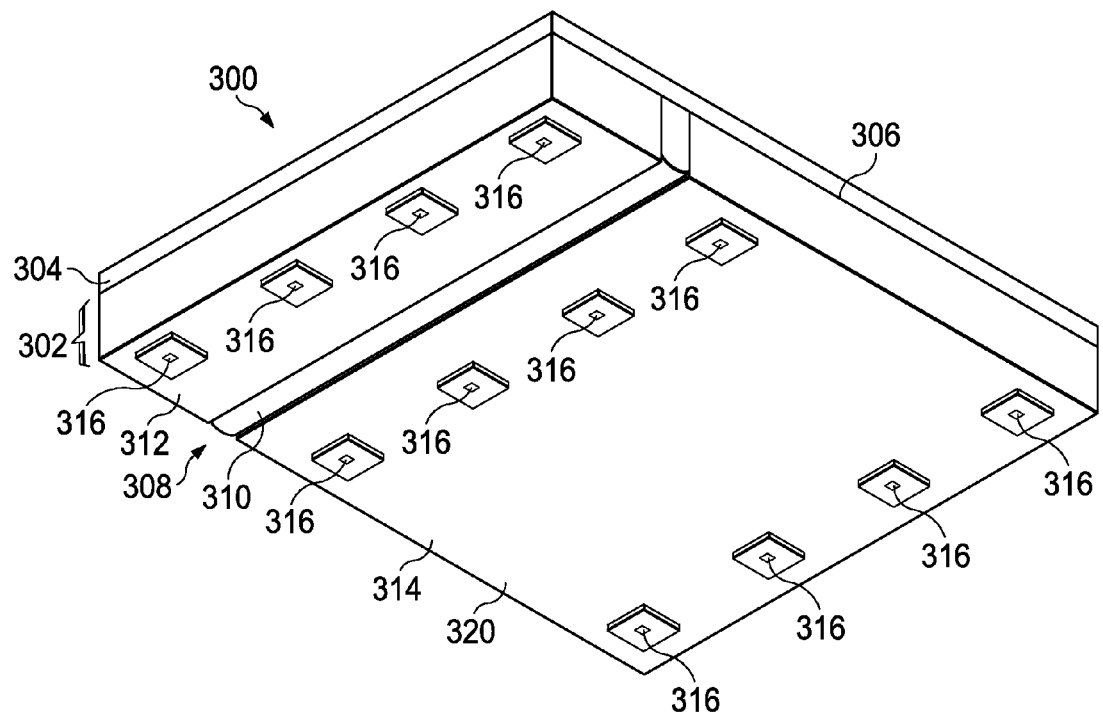
Figure 3B:
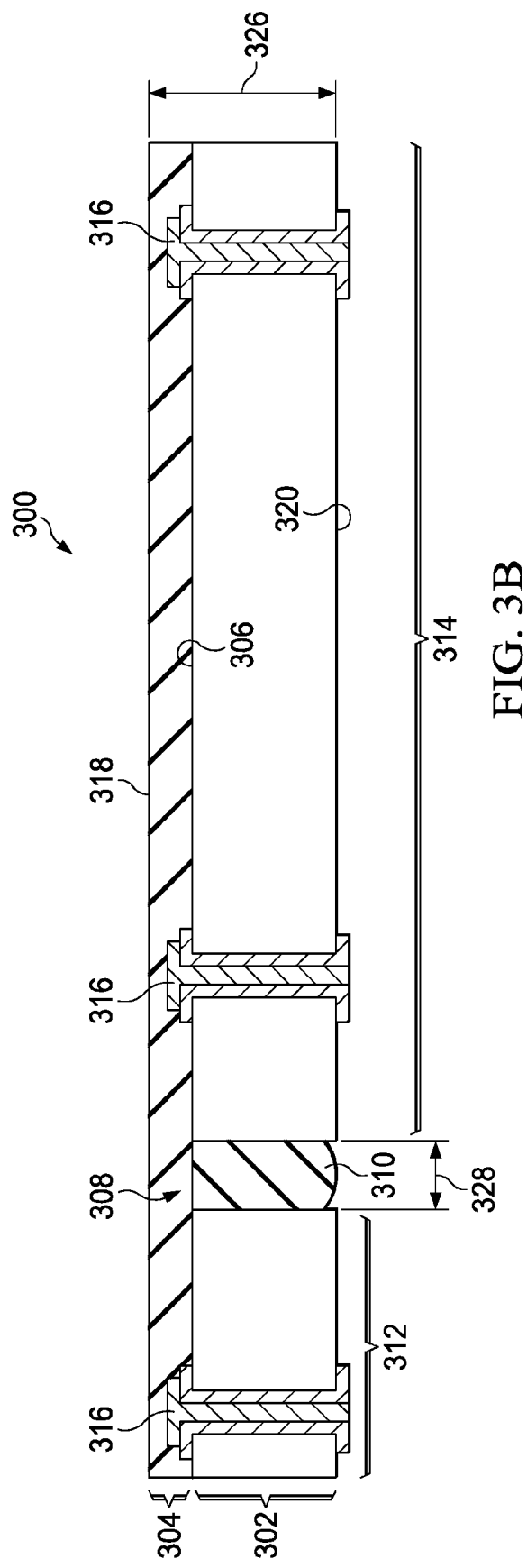

FIG. 3A through FIG. 3C are views of a further example semiconductor device containing an isolation region and an isolated component. Referring to FIG. 3A, which is a top perspective view, the semiconductor device 300 includes a substrate 302 comprising a semiconductor material, for example as described in reference to FIG. 1A. The semiconductor device 300 includes an interconnect region 304 at a top surface 306 of the substrate 302. The interconnect region 304 includes layers of dielectric material, one or more levels of metal lines, contacts connecting the metal lines to components in the substrate 302, and possibly vias connecting the metal lines of different levels. The semiconductor device 300 further includes an isolation region 308 in which the semiconductor material has been removed from the substrate 302 and replaced with dielectric replacement material 310. In the instant example, the isolation region 308 extends to a lateral boundary of the semiconductor device 300, and separates an isolated portion 312 of the substrate 302 from a primary portion 314 of the substrate 302. The interconnect region 304 is continuous over the isolation region 308. The interconnect region 304 has a top surface 318 at an opposite face of the interconnect region 304 from the top surface 306 of the substrate 302.

Referring to FIG. 3B, which is a cross section through the semiconductor device 300, the isolation region 308 extends from a bottom surface 320 of the substrate 302 to the interconnect region 304. The dielectric replacement material 310 substantially fills the isolation region 308. The dielectric replacement material 310 may include organic dielectric material or inorganic dielectric material. The dielectric replacement material 310 does not cover the bottom surface 320 of the substrate 302, and in the instant example, the bottom surface 320 is substantially free of the dielectric replacement material 310. An isolated component, not shown in FIG. 3B, is disposed in the isolated portion 312 of the substrate 302. The dielectric replacement material 310 in the isolation region 308 separates the isolated component in the isolated portion 312 of the substrate 302 from the primary portion 314 of the substrate 302. One or more active components, not shown in FIG. 3B, are disposed in the primary portion 314 of the substrate 302. A thickness 326 of the substrate 302 may be 200 microns for a thinned substrate 302 to 600 microns for a full-thickness substrate 302. In the instant example, a width 328 of the isolation region 308 may be, for example, 10 microns to 500 microns. Contacts, metal lines and vias in the interconnect region 304 provide electrical connections to the isolated component and the active components. In the instant example, the semiconductor device 300 includes through-substrate vias (TSVs) 316 extending through the substrate 302 in the isolated portion 312 and/or the primary portion 314. Disposing the isolated component in the isolated portion 312 of the substrate 302 may advantageously reduce a total cost of circuit application using the semiconductor device 300 compared to disposing the isolated component in a separate device.

Referring to FIG. 3C, which is a bottom perspective view of the semiconductor device 300, the bottom surface 320 of the substrate 302 is substantially free of the dielectric replacement material 310 of the isolation region 308. A boundary between the isolated portion 312 of the substrate 302 and the isolation region 308 may be contoured, for example with a finger pattern or a dovetail pattern, to improve mechanical integrity of the semiconductor device 300. A boundary between the primary portion 314 of the substrate 302 and the isolation region 308 may be contoured, to provide a similar advantage.

Figure 4A:
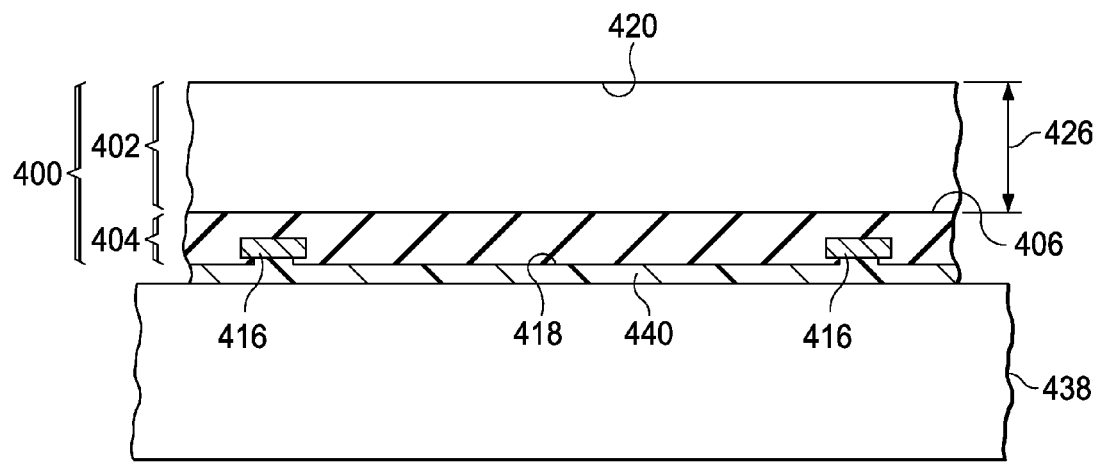
FIG. 4A through FIG. 4G are cross sections of a semiconductor device containing an isolation region and an isolated component, depicted in key steps of an example process of forming the semiconductor device.

FIG. 4A through FIG. 4G are cross sections of a semiconductor device containing an isolation region and an isolated component, depicted in key steps of an example process of forming the semiconductor device. Referring to FIG. 4A, the semiconductor device 400 is formed on a substrate 402 comprising a semiconductor material such as silicon. The substrate 402 may be a bulk semiconductor wafer containing a plurality of semiconductor devices. The substrate 402 may optionally include an epitaxial layer of semiconductor material. The semiconductor device 400 includes an interconnect region 404 formed at a top surface 406 of the substrate 402. The interconnect region 404 includes layers of dielectric material, one or more levels of metal lines, contacts connecting the metal lines to components in the substrate 402, and possibly vias connecting the metal lines of different levels. The semiconductor device 400 includes an isolated component, not shown in FIG. 4A. In the instant example, the semiconductor device 400 includes bond pads 416 at, or proximate to, the top surface 418 of the interconnect region 404.

The semiconductor device 400 is mounted on a carrier 438 with the top surface 418 of the interconnect region 404 nearest the carrier 438 and a bottom surface 420 of the substrate 402 exposed. The carrier 438 may be, for example, a silicon wafer or a ceramic disk. The semiconductor device 400 may be mounted to the carrier 438 with a temporary bonding material 440 such as Brewer Science WaferBOND® HT-10.10.

A thickness 426 of the substrate 402 may be 500 microns to 600 microns, for example a full thickness of a commercial silicon wafer. Alternatively, the thickness 426 may be 200 microns to 300 microns, resulting from thinning the substrate 402 after forming the interconnect region 404, for example by backgrinding. Other values of the thickness 426 of the substrate 402 are within the scope of the instant example.

Figure 4B:
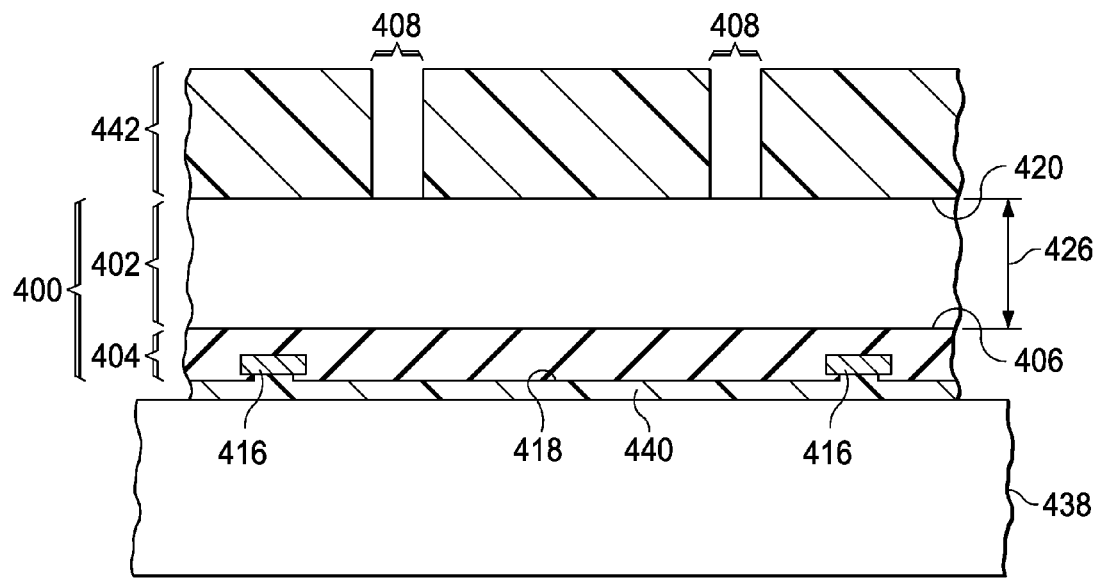

Referring to FIG. 4B, an isolation mask 442 is formed at the bottom surface 420 of the substrate 402 so as to expose an area for an isolation region 408. The isolation mask 442 may include primarily photoresist formed by a photolithographic process. Forming the isolation mask 442 primarily of photoresist has an advantage of low fabrication cost, and may be appropriate for thinned substrates 402. Alternatively, the isolation mask 442 may include primarily hard mask material such as silicon nitride, silicon carbide or amorphous carbon, formed by a plasma enhanced chemical vapor deposition (PECVD) process. Forming the isolation mask 442 primarily of hard mask material has an advantage of durability and dimensional stability, and may be appropriate for full-thickness substrates 402. The area exposed by the isolation mask 442 may be as described in any of the examples disclosed in reference to FIG. 1A through FIG. 3C.

Figure 4C:
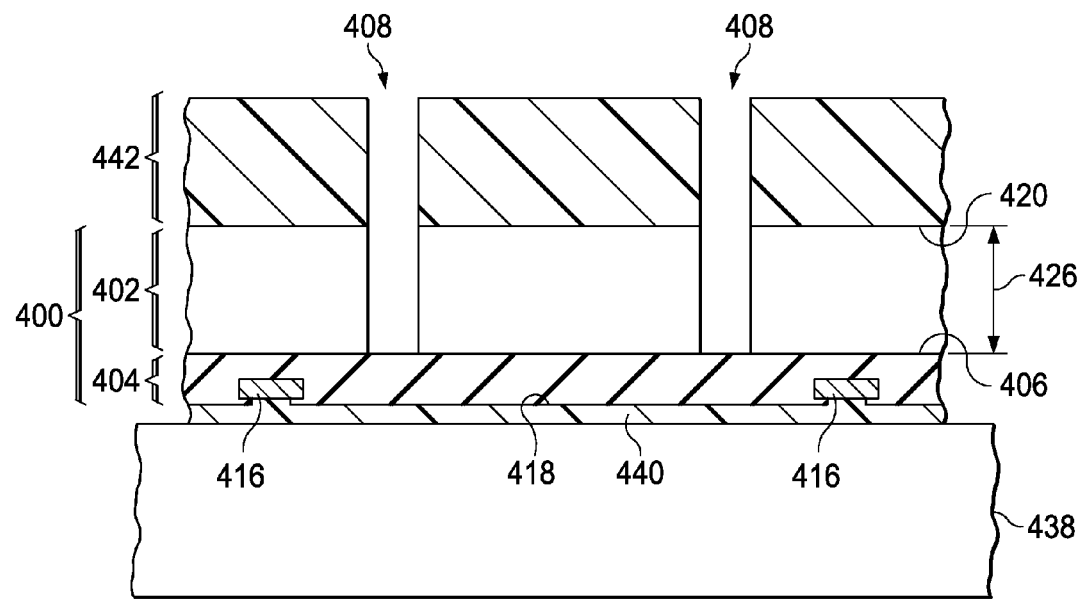

Referring to FIG. 4C, semiconductor material of the substrate 402 is removed in the area exposed by the isolation mask 442 to form the isolation region 408. The semiconductor material of the substrate 402 may be removed by a deep reactive ion etch (DRIE) process. One example of a DRIE process, referred to as the Bosch process, alternately removes material at a bottom of an etched region and passivates sidewalls of the etched region, so as to maintain a desired profile of the etched region. Another example is a continuous DRIE process which simultaneously alternately removes material at a bottom of an etched region and passivates sidewalls of the etched region. The isolation region 408 extends to the interconnect region 404. In one version of the instant example, an insignificant amount of the interconnect region 404 is removed.

Figure 4D:
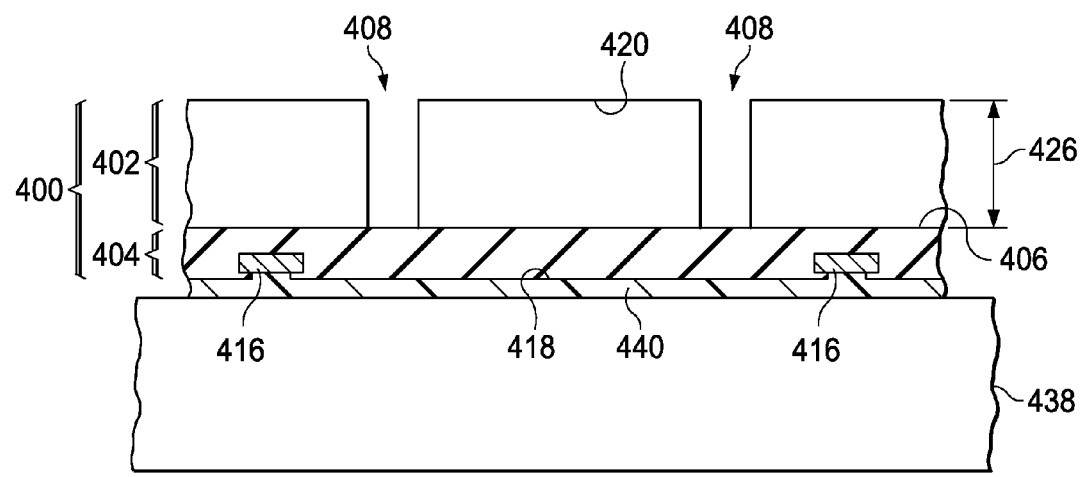

Referring to FIG. 4D, the isolation mask 442 of FIG. 4C is removed. Photoresist in the isolation mask 442 may be removed by an ash process or an ozone etch process, followed by a wet clean process. Hard mask material in the isolation mask 442 may be removed by a plasma etch process which is selective to the semiconductor material in the substrate 402 and the dielectric layers in the interconnect region 404.

Figure 4E:
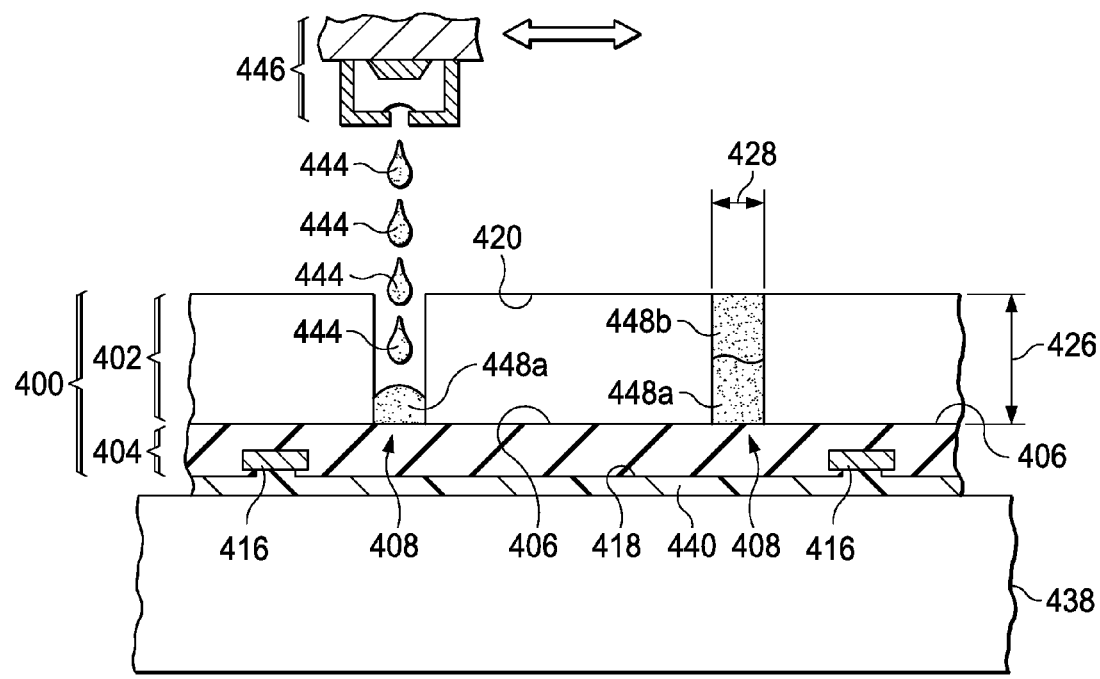

Referring to FIG. 4E, dielectric-containing fluid droplets 444 are delivered to the isolation region 408 by a droplet delivery apparatus 446 similar to an inkjet apparatus. The dielectric-containing fluid droplets 444 may include, for example, uncured epoxy, uncured polyimide, uncured BCB, ceramic slurry, sol-gel, or siloxane-containing fluid such as methyl-silsesquioxane (MSQ). The dielectric-containing fluid droplets 444 may include solvent or other volatile fluid, which is subsequently removed. The dielectric-containing fluid droplets 444 may include two reactive component fluids, such as epoxy resin and hardener, which are mixed just prior to delivery from the droplet delivery apparatus 446. The droplet delivery apparatus 446 and the semiconductor device 400 may be moved laterally with respect to each other, for example in a raster-scan mode or a vector-scan mode, to deliver the dielectric-containing fluid droplets 444 into the isolation region 408 without delivering the dielectric-containing fluid droplets 444 onto the bottom surface 420 of the substrate 402. In one version of the instant example, the semiconductor device 400 may remain stationary while the droplet delivery apparatus 446 is moved laterally in two dimensions. In another version, the droplet delivery apparatus 446 may remain stationary while the semiconductor device 400 is moved laterally in two dimensions. In a further version, the droplet delivery apparatus 446 may be moved in one dimension while the semiconductor device 400 may be moved in a second, orthogonal, dimension. The isolation region is filled with dielectric-containing fluid 448 from the dielectric-containing fluid droplets 444. The dielectric-containing fluid 448 may include two separate fluids delivered sequentially: a first dielectric-containing fluid 448a which is delivered first, and so is disposed adjacent to the interconnect region 404, and a second dielectric-containing fluid 448b which is delivered second, and so is disposed on the first dielectric-containing fluid 448a. Two separate first dielectric-containing fluids 448a and 448b may provide desired mechanical integrity. The droplet delivery apparatus 446 may be configured to deliver droplets 444 which are a few microns in diameter. A width 428 of the isolation region 408 may be 10 microns to 25 microns, which may reduce an overall size of the semiconductor device 400 and hence advantageously reduce a fabrication cost. Forming the dielectric-containing fluid 448 in the isolation region 408 with a width 428 of 10 microns to 25 microns using the droplet delivery apparatus 446 may advantageously reduce fabrication cost and complexity compared to other methods. The carrier 438 advantageously maintains dimensional stability of the substrate 402 and reduces stress on the interconnect region 404 while the isolation region 408 is filled. In a variation of the instant example, the semiconductor device 400 may be removed from the carrier 438 prior to filling the isolation region 408, and supported by alternate means such as a vacuum chuck while the isolation region 408 is filled.

Figure 4F:
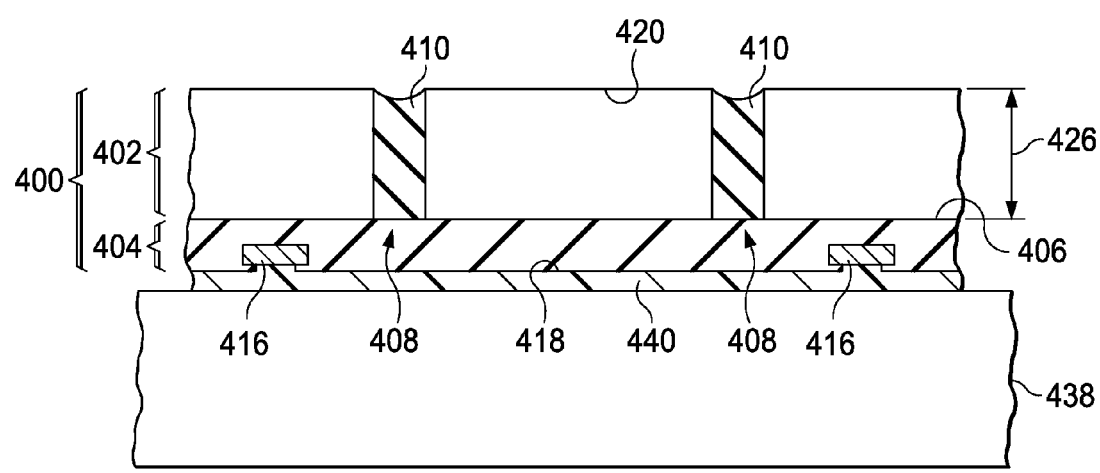

Referring to FIG. 4F, the dielectric-containing fluid 448 of FIG. 4E in the isolation region 408 is cured, dried or otherwise processed, as necessary, to form the dielectric material 410 in the isolation region 408. The semiconductor device 400 may be, for example, baked in a vacuum or inert ambient to convert the dielectric-containing fluid 448 into the dielectric material 410.

Figure 4G:
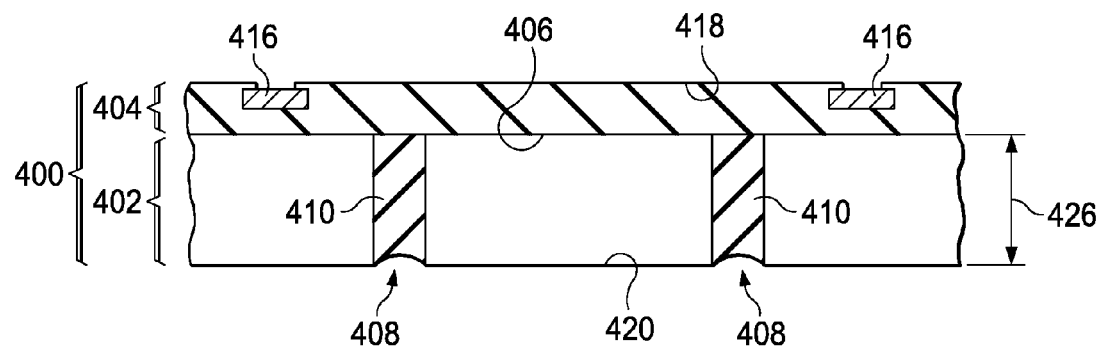

Referring to FIG. 4G, the semiconductor device 400 is removed from the carrier 438 of FIG. 4F. The semiconductor device 400 may be removed, for example, by heating the temporary bonding material 440 of FIG. 4F to soften the temporary bonding material 440, and laterally sliding the semiconductor device 400 off the carrier 438. The temporary bonding material 440 is subsequently removed, for example by dissolving in an organic solvent.

Figure 5A:
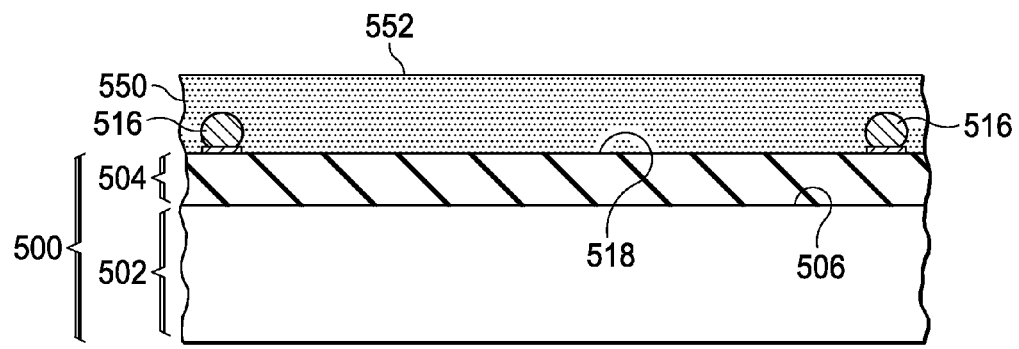
FIG. 5A through FIG. 5H are cross sections of a semiconductor device containing an isolation region and an isolated component, depicted in key steps of another example process of forming the semiconductor device.

FIG. 5A through FIG. 5H are cross sections of a semiconductor device containing an isolation region and an isolated component, depicted in key steps of another example process of forming the semiconductor device. Referring to FIG. 5A, the semiconductor device 500 is formed on a substrate 502 as described in reference to FIG. 4A. The substrate 502 may be a bulk semiconductor wafer containing a plurality of semiconductor devices. The semiconductor device 500 includes an interconnect region 504 formed at a top surface 506 of the substrate 502. The interconnect region 504 includes layers of dielectric material, one or more levels of metal lines, contacts connecting the metal lines to components in the substrate 502, and possibly vias connecting the metal lines of different levels. The semiconductor device 500 includes an isolated component, not shown in FIG. 5A. In the instant example, the semiconductor device 500 includes solder bumps 516 at the top surface 518 of the interconnect region 504.

A protective coating 550 is formed over the top surface 518 of the interconnect region 504, covering the solder bumps 516. The protective coating 550 may include one or more layers of organic material, such as novolac resin. The protective coating 550 may be formed by spin coating a mixture of the organic resin and a suitable solvent such as propylene glycol monomethyl ether acetate (PGMEA), followed by removal of most of the solvent by baking. An example commercial product suitable for forming the protective coating 550 is Microposit FSC-M made by Dow Chemical Company. Spin coating may advantageously provide a desired degree of planarity for a top surface 552 of the protective coating 550.

Figure 5B:
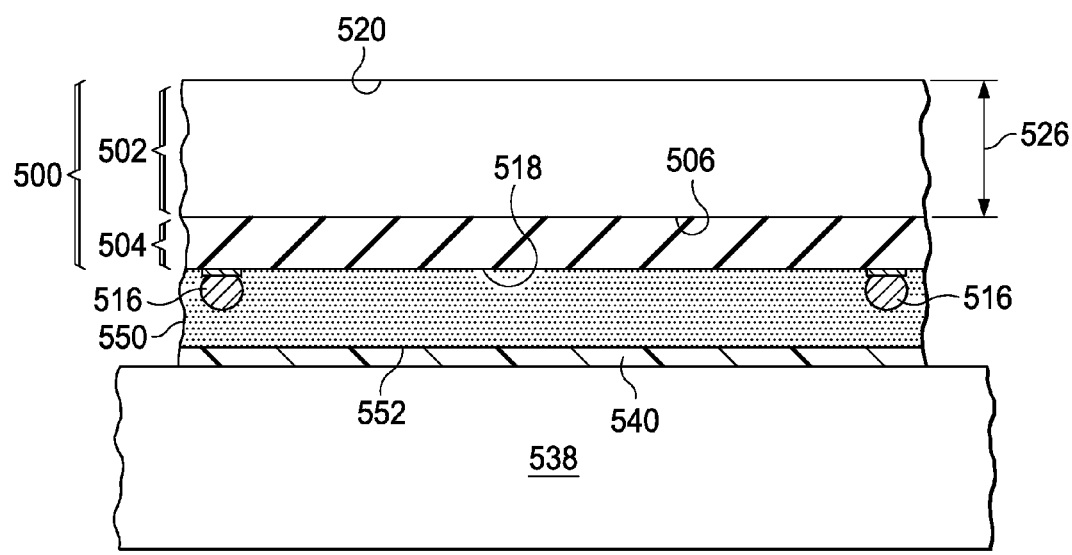

Referring to FIG. 5B, the semiconductor device 500 is mounted on a carrier 538 with the top surface 552 of the protective coating 550 nearest the carrier 538 and a bottom surface 520 of the substrate 502 exposed. The semiconductor device 500 may be mounted to the carrier 538 with a temporary bonding material 540. The carrier 538 and the temporary bonding material 540 may be as described in reference to FIG. 4A. The protective coating 550 advantageously reduces stress and damage to the solder bumps 516 when the semiconductor device 500 is mounted on the carrier 538.

A thickness 526 of the substrate 502 may range from 500 microns to 600 microns, for a full thickness of a commercial silicon wafer, to 200 microns to 300 microns, for a thinned substrate 502. Other values of the thickness 526 of the substrate 502 are within the scope of the instant example.

Figure 5C:
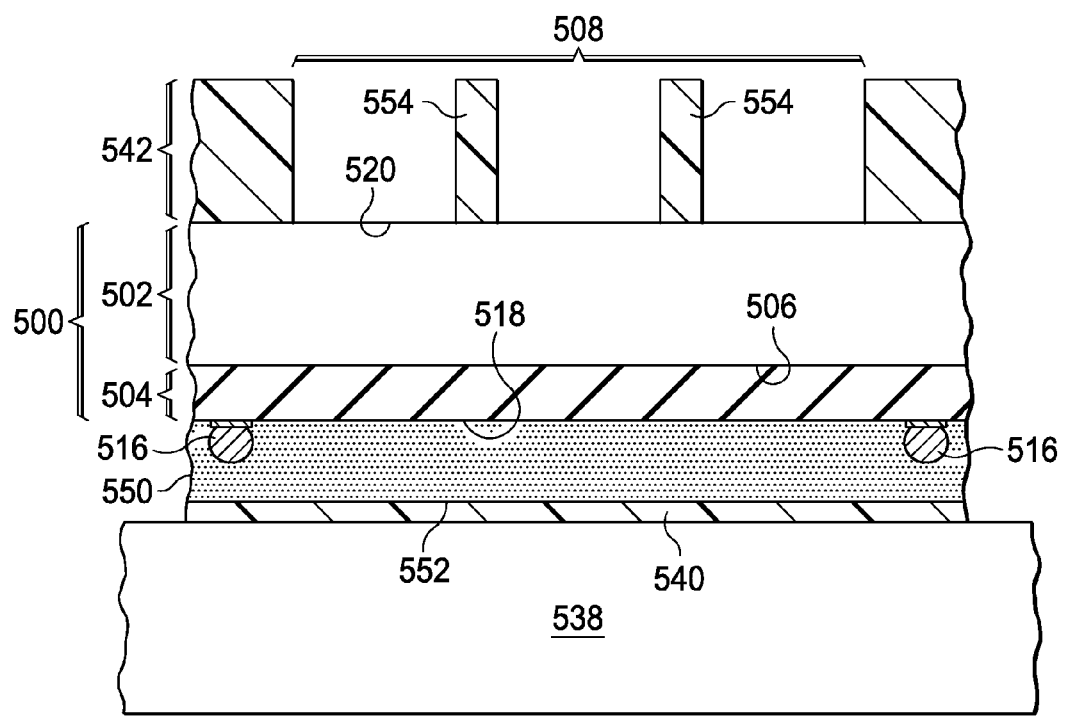

Referring to FIG. 5C, an isolation mask 542 is formed at the bottom surface 520 of the substrate 502 so as to expose an area for an isolation region 508. The isolation mask 542 may include primarily photoresist or may include hard mask material, as described in reference to FIG. 4B. The area exposed by the isolation mask 542 may be as described in any of the examples disclosed in reference to FIG. 1A through FIG. 3C. In the instant example, the isolation mask 542 includes dummy mask elements 554 in the area for the isolation region 508.

Figure 5D:
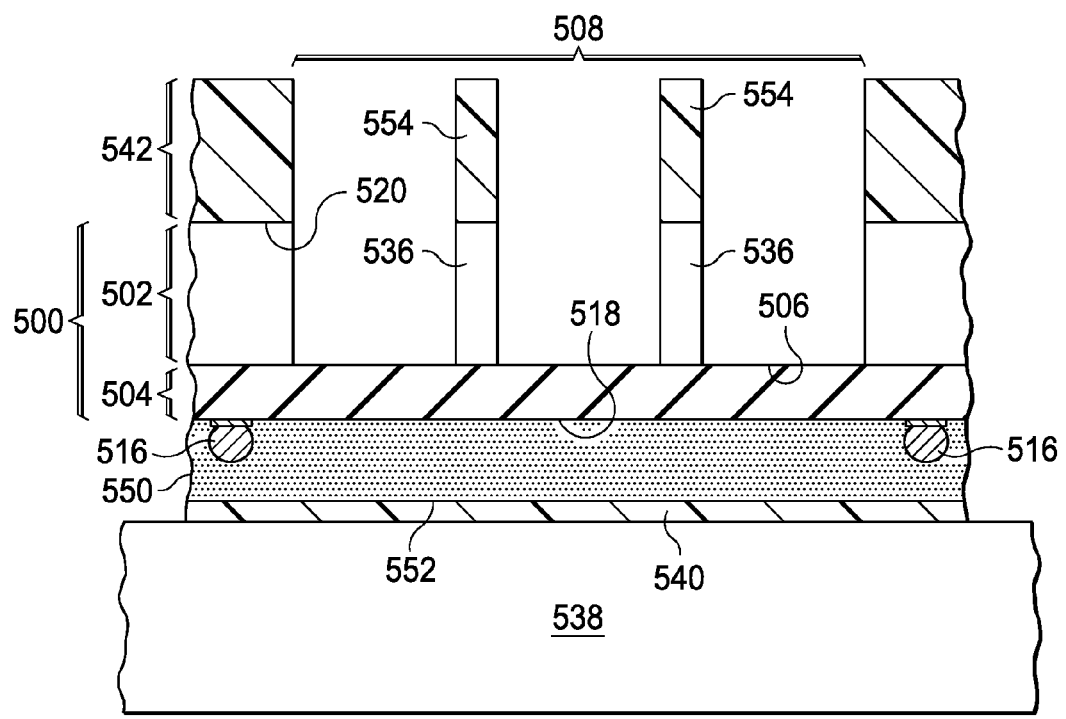

Referring to FIG. 5D, the semiconductor material of the substrate 502 is removed in the area exposed by the isolation mask 542 to form the isolation region 508. The semiconductor material of the substrate 502 may be removed by a DRIE process as described in reference to FIG. 4C. The dummy mask elements 554 block removal of the semiconductor material of the substrate 502 so that dummy elements 536 of are formed of the semiconductor material of the substrate 502 in the isolation region 508. The isolation region 508 extends to the interconnect region 504. In one version of the instant example, an insignificant amount of the interconnect region 504 is removed.

Figure 5E:
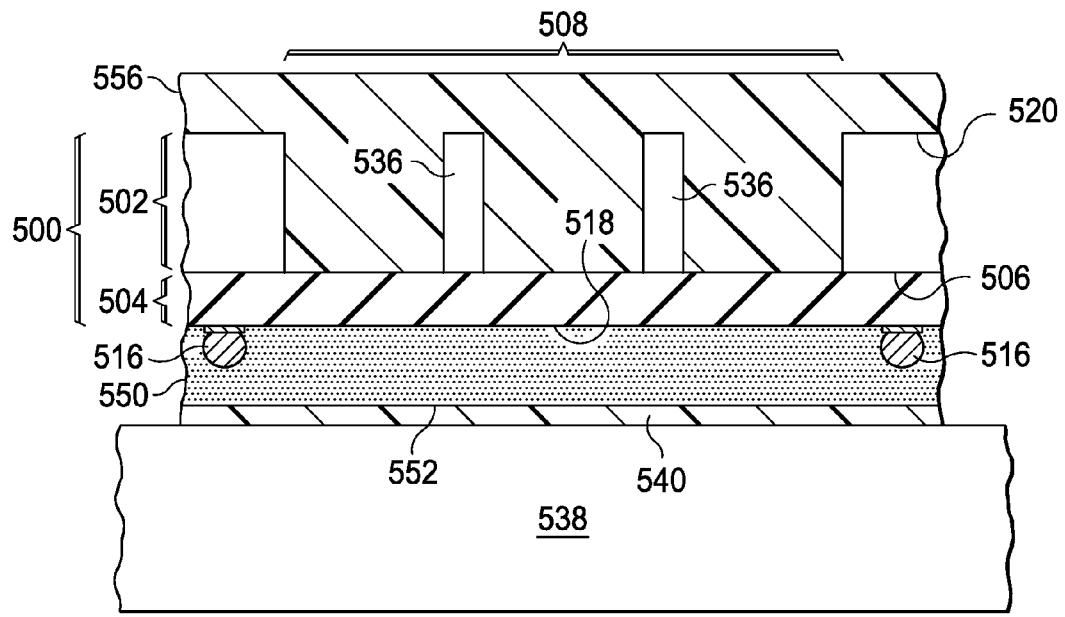

Referring to FIG. 5E, the isolation mask 542 of FIG. 5D is removed, for example as described in reference to FIG. 4D. A layer of dielectric fill material 556 is formed in the isolation region 508 and on the bottom surface 520 of the substrate 502. The layer of dielectric fill material 556 may include organic dielectric material such as BCB or polyimide, and/or may include inorganic material such as silicon dioxide-base dielectric material, ceramic, or sol-gel. The layer of dielectric fill material 556 may be formed by spin coating followed by drying or curing, chemical vapor deposition, or a plasma process such as a high density plasma (HDP) process. The layer of dielectric fill material 556 fills both narrow portions of the isolation region 508, 10 microns wide to 100 microns wide, and wide portions of the isolation region 508, more than 200 microns wide, concurrently, which may advantageously reduce cycle time and fabrication cost compared to other methods.

Figure 5F:
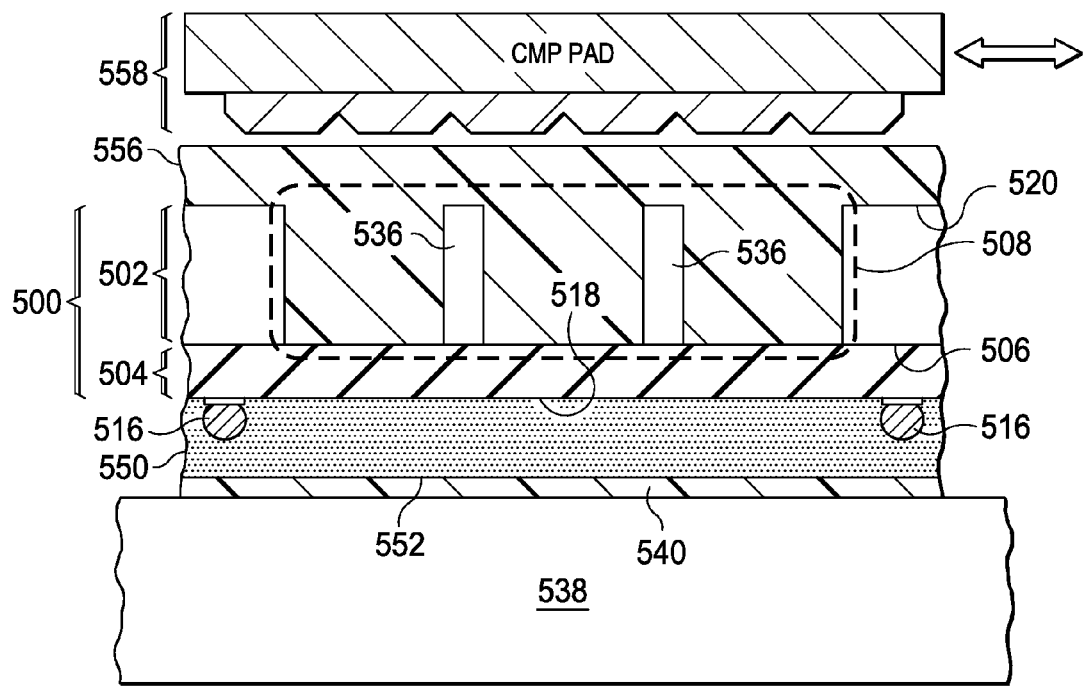

Referring to FIG. 5F, the layer of dielectric fill material 556 is removed from the bottom surface 520 of the substrate 502, leaving the layer of dielectric fill material 556 in the isolation region 508. The layer of dielectric fill material 556 may be removed from the bottom surface 520 by a chemical mechanical polish (CMP) process 558 as depicted in FIG. 5F. The dummy elements 536 may advantageously reduce dishing by the CMP process. Alternatively, the layer of dielectric fill material 556 may be removed by an etchback process, such as an isotropic plasma etch process. FIG. 5F depicts the semiconductor device 500 partway through the process of removing the layer of dielectric fill material 556 from the bottom surface 520.

Figure 5G:
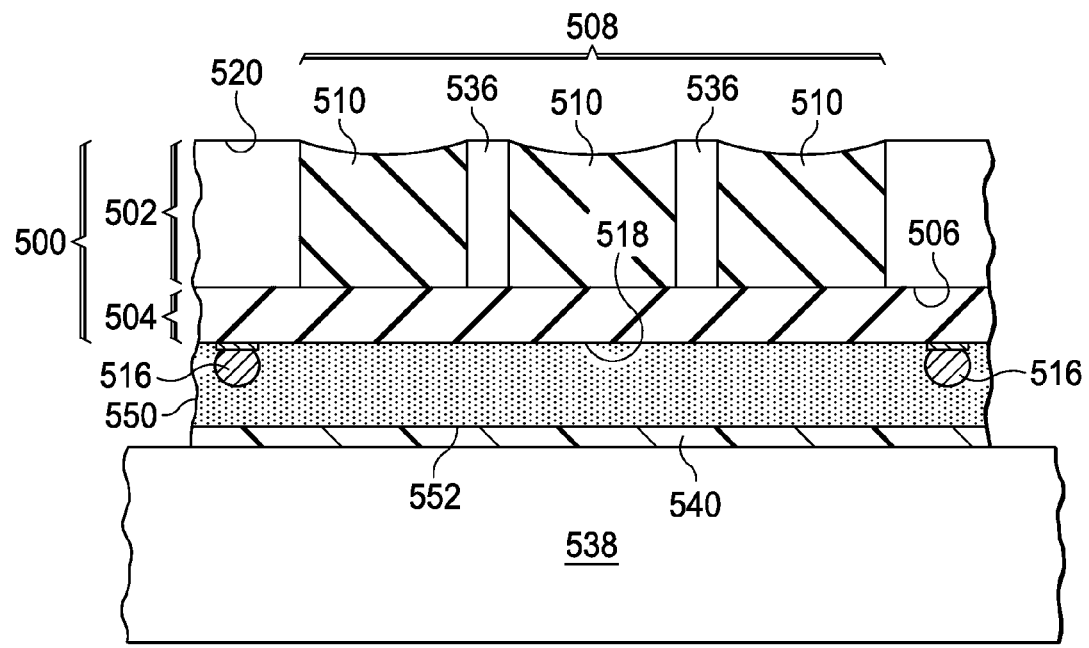

FIG. 5G depicts the semiconductor device 500 after the process of removing the layer of dielectric fill material 556 of FIG. 5F from the bottom surface 520 is complete. The layer of dielectric fill material 556 remaining in the isolation region 508 provides a dielectric replacement material 510. The dummy elements 536 may advantageously provide that the dielectric replacement material 510 is acceptably coplanar with the bottom surface 520 of the substrate 502. Further curing or drying may be performed on the dielectric replacement material 510 at this point.

Figure 5H:
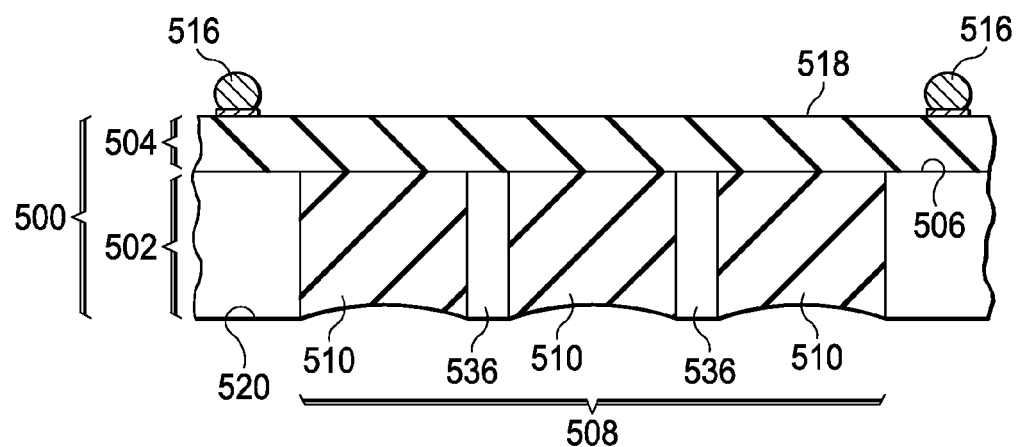

Referring to FIG. 5H, the semiconductor device 500 is removed from the carrier 538 of FIG. 5G. The semiconductor device 500 may be removed, for example, by heating the temporary bonding material 540 of FIG. 5G to soften the temporary bonding material 540, and laterally sliding the semiconductor device 500 off the carrier 538. The temporary bonding material 540 is subsequently removed, for example by dissolving in an organic solvent. Similarly, the protective coating 550 of FIG. 5G is removed from the top surface 518 of the interconnect region 504, for example by dissolving in an organic solvent. The temporary bonding material 540 and the protective coating 550 may be removed concurrently with a suitable solvent.

Figure 6:
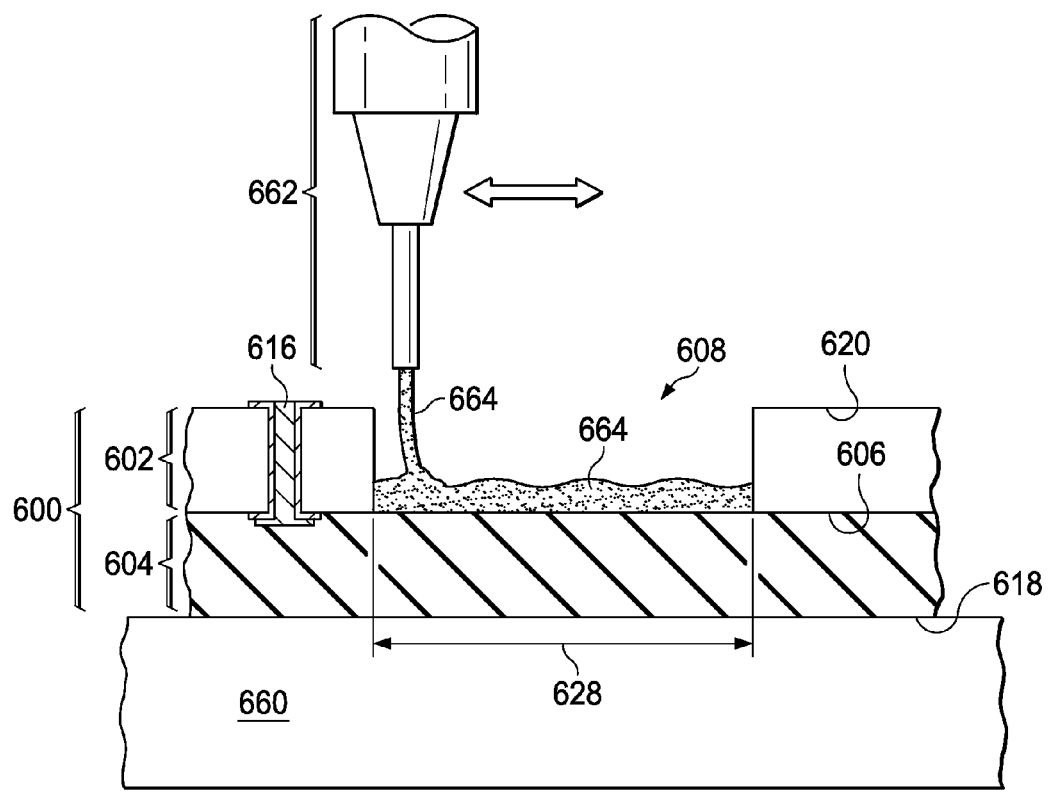
FIG. 6 is a cross sections of a semiconductor device containing an isolation region and an isolated component, depicted in a key step of a further example process of forming the semiconductor device.

FIG. 6 is a cross section of a semiconductor device containing an isolation region and an isolated component, depicted in a key step of a further example process of forming the semiconductor device. The semiconductor device 600 is formed on a substrate 602 as described in reference to FIG. 4A. The substrate 602 may be a bulk semiconductor wafer containing a plurality of semiconductor devices. The semiconductor device 600 includes an interconnect region 604 formed at a top surface 606 of the substrate 602. The interconnect region 604 includes layers of dielectric material, one or more levels of metal lines, contacts connecting the metal lines to components in the substrate 602, and possibly vias connecting the metal lines of different levels. The semiconductor device 600 includes an isolated component, not shown in FIG. 5A. In the instant example, the semiconductor device 600 includes TSVs 616 extending through the substrate 602; the top surface 618 of the interconnect region 604 is free of metal structures. Semiconductor material of the substrate 602 is removed in an area for an isolation region 608, for example as described in reference to FIG. 4B through FIG. 4D.

The semiconductor device 600 is disposed on a platform 660 which may be a wafer chuck or a vacuum chuck. A dispensing apparatus 662 delivers a contiguous flow of dielectric-containing fluid 664 into the isolation region 608. The contiguous flow is distinct from a droplet-based delivery method. The dielectric-containing fluid 664 may include, for example, uncured epoxy, uncured polyimide, uncured BCB, ceramic slurry, sol-gel, or siloxane-containing fluid. The dielectric-containing fluid 664 may include solvent or other volatile fluid, which is subsequently removed. The dielectric-containing fluid 664 may include two reactive component fluids, such as epoxy resin and hardener, which are mixed just prior to delivery from the dispensing apparatus 662. The dielectric-containing fluid 664 may include two separate fluids, dispensed sequentially, as described in reference to FIG. 4E. The dispensing apparatus 662 and the semiconductor device 600 may be moved laterally with respect to each other to deliver the dielectric-containing fluid 664 into the isolation region 608 without delivering the dielectric-containing fluid 664 onto the bottom surface 620 of the substrate 602. The isolation region is filled with the dielectric-containing fluid 664. The dispensing apparatus 662 may be particularly suited to filling the isolation region 608 with a width 628 greater than 200 microns more quickly than other methods, which may reduce a fabrication cost. In a variation of the instant example, the semiconductor device 600 may be mounted on a carrier prior to filling the isolation region 608, as described in other example herein. The dielectric-containing fluid 664 in the isolation region 608 is cured, dried or otherwise processed, as necessary, to form a stable dielectric material in the isolation region 608.

Figure 7:
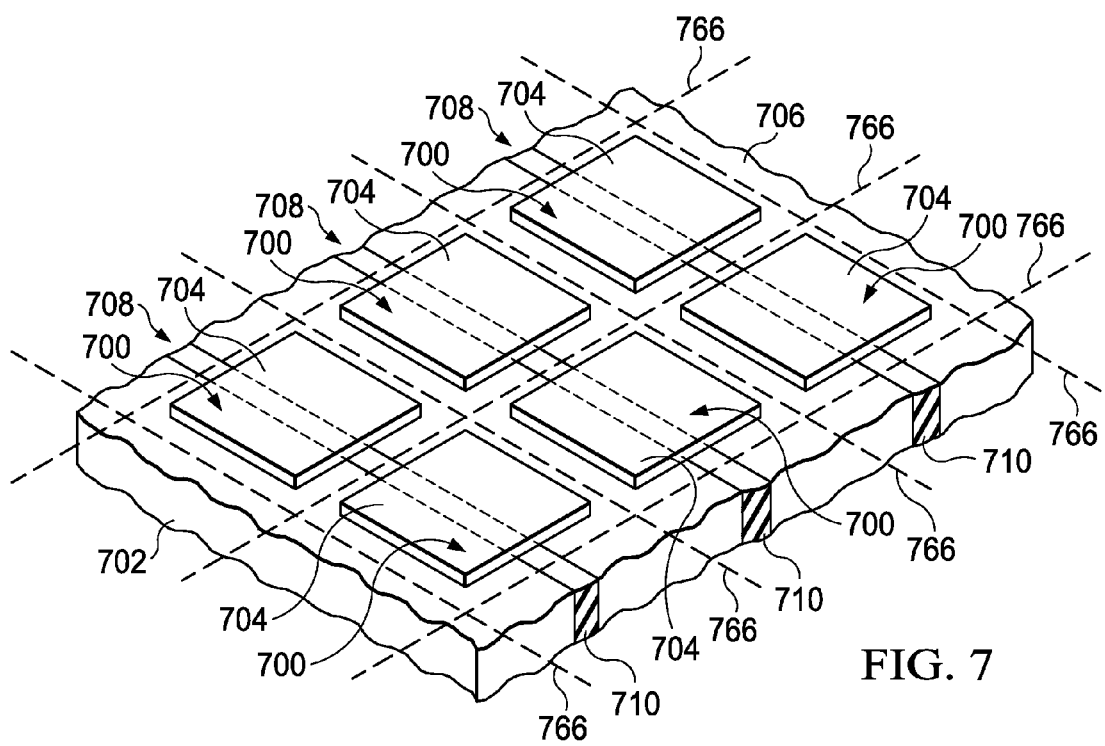
FIG. 7 is a perspective of a plurality of semiconductor devices containing isolation regions, showing an example diagram for singulation.

FIG. 7 is a perspective of a plurality of semiconductor devices containing isolation regions, showing an example diagram for singulation. The semiconductor devices 700 are formed on substrate 702 comprising a semiconductor material. The substrate 702 may be a silicon wafer, possibly with an epitaxial layer. Each semiconductor device 700 includes an interconnect region 704 formed on a top surface 706 of the substrate 702. Isolation regions 708 are formed in the substrate 702, replacing the semiconductor material of the substrate 702 with dielectric replacement material 710, for example as described in the examples herein. Scribelines 766 separate adjacent semiconductor devices 700. The scribelines 766 provide space for singulating the semiconductor devices 700. The scribelines 766 may be, for example, 50 microns to 250 microns wide. The substrate 702 combined with the dielectric replacement material 710 in the isolation regions 708 is continuous across the scribelines 766. In the instant example, the dielectric replacement material 710 and the isolation regions 708 extend across the scribelines 766.

The semiconductor devices 700 are subsequently singulated along the scribelines 766, for example by sawing, mechanical scribing, laser scribing or cleaving. The singulation process cuts through the dielectric replacement material 710 in the scribelines 766. Configuring the isolation regions 708 to be continuous across the scribelines 766 may enable more design latitude for the semiconductor devices 700 and advantageously reduce size and lower fabrication costs.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising a semiconductor material, the substrate having a primary portion;
   an active component disposed in the primary portion of the substrate;
   an interconnect region disposed on a top surface of the substrate;
   an isolation region separate from the primary portion of the substrate, the isolation region extending from the top surface of the substrate to a bottom surface of the substrate, the isolation region being free of the semiconductor material, the interconnect region being continuous over the isolation region;
   a dielectric replacement material disposed in the isolation region; and
   an isolated component separated from the primary portion of the substrate by the dielectric replacement material in the isolation region.

2. The semiconductor device of claim 1, wherein the isolated component is disposed in the interconnect region, and the isolation region is disposed below the isolated component.

3. The semiconductor device of claim 2, wherein the isolated component is a capacitor.

4. The semiconductor device of claim 2, wherein the isolation region is more than 100 microns wide.

5. The semiconductor device of claim 1, wherein the isolation region separates the primary portion of the substrate from an isolated portion of the substrate, and the isolated component is disposed in the isolated portion of the substrate.

6. The semiconductor device of claim 5, wherein the isolation region laterally surrounds the isolated portion of the substrate, and the primary portion laterally surrounds the isolation region.

7. The semiconductor device of claim 5, wherein the isolation region extends to a lateral boundary of the semiconductor device.

8. The semiconductor device of claim 5, wherein a width of the isolation region is 10 microns to 25 microns.

9. The semiconductor device of claim 1, wherein the dielectric replacement material comprises organic dielectric material.

10. The semiconductor device of claim 1, wherein the dielectric replacement material comprises inorganic dielectric material.

11. The semiconductor device of claim 1, further comprising dummy elements of the semiconductor material disposed in the isolation region, the dummy elements being surrounded by the dielectric replacement material, the dummy elements being free of active components.

* * * * *